United States Patent [19]

Koshikawa et al.

[11] Patent Number: 5,287,011

[45] Date of Patent: Feb. 15, 1994

[54] POWER-ON DETECTING CIRCUIT DESIRABLE FOR INTEGRATED CIRCUIT EQUIPPED WITH INTERNAL STEP-DOWN CIRCUIT

[75] Inventors: Yasuji Koshikawa; Takahiro Hara; Tadahiko Sugibayashi, all of Tokyo, Japan

[73] Assignee: NEC Corporation, Tokyo, Japan

[21] Appl. No.: 912,756

[22] Filed: Jul. 13, 1992

[30] Foreign Application Priority Data

Jul. 11, 1991 [JP] Japan .................................. 3-170834

[51] Int. Cl.[5] ............................................. H03K 3/01
[52] U.S. Cl. ............................. 307/272.3; 307/296.6; 307/296.1
[58] Field of Search ............... 307/296.1, 296.4, 296.6, 307/272.3

[56] References Cited

U.S. PATENT DOCUMENTS

| 3,862,437 | 1/1975 | Rossell | 307/296.1 |
| 5,039,875 | 8/1991 | Chang | 307/272.3 |
| 5,130,569 | 7/1992 | Glica | 307/272.3 |
| 5,184,031 | 2/1993 | Hayakawa et al. | 307/296.1 |
| 5,189,316 | 2/1993 | Murakami et al. | 307/296.1 |

Primary Examiner—William L. Sikes
Assistant Examiner—My Trang Ton
Attorney, Agent, or Firm—Sughrue, Mion, Zinn, Macpeak & Seas

[57] ABSTRACT

A power-on detecting circuit produces a power-on signal upon power-on event for initializing internal component circuits, and comprises a timing generating unit for producing a timing signal when a power voltage level reaches a predetermined voltage level, a monitoring unit for producing an enable signal when a step-down power voltage level reaches a constant level, and a signal generating unit for producing the power-on signal in the concurrent presence of the enable signal and the timing signal, thereby guaranteeing the initialization of the internal component circuits.

10 Claims, 5 Drawing Sheets

POWER-ON DETECTING CIRCUIT DESIRABLE FOR INTEGRATED CIRCUIT EQUIPPED WITH INTERNAL STEP-DOWN CIRCUIT

FIELD OF THE INVENTION

This invention relates to a power-on detecting circuit and, more particularly, to a power-on detecting circuit desirable for an ultra large scale integrated circuit equipped with a step-down voltage generating circuit.

DESCRIPTION OF THE RELATED ART

Figure 1:
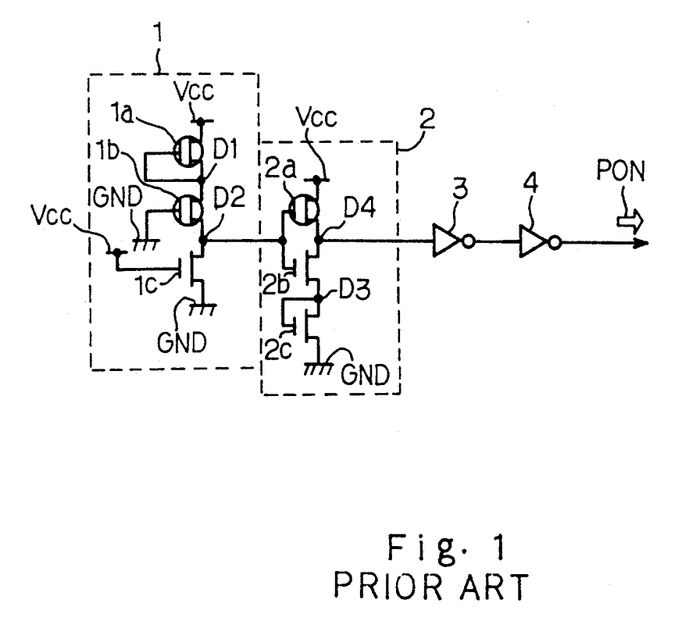
FIG. 1 is a circuit diagram showing the circuit arrangement of the prior art power-on detecting circuit.

When a power switch turns on, it is necessary for an electronic system to initialize component digital circuits, and a power-on detecting circuit is usually provided in association with the power supply line. FIG. 1 shows a typical example of a power-on detecting circuit incorporated in a semiconductor integrated circuit, and largely comprises a voltage divider 1, a threshold circuit 2 and a series combination of inverters 3 and 4. The voltage divider 1 is implemented by a series combination of load transistors 1a, 1b and 1c coupled between the power supply line Vcc and a ground voltage line GND. The load transistor 1a is of the p-channel enhancement type, and the gate electrode thereof is coupled with the drain node D1 thereof. The load transistor 1b is also of the p-channel enhancement type, and the gate electrode thereof is coupled with the ground voltage line GND. However, the load transistor 1c is of the n-channel enhancement type, and the gate electrode thereof is coupled with the power supply line Vcc. The voltage divider 11a is operative to divide the power voltage level Vcc, and step-down voltage level takes place at the drain node D2.

The threshold circuit 2 is implemented by a series combination of a p-channel enhancement type switching transistor 2a, an n-channel enhancement type switching transistor 2b and an n-channel enhancement type load transistor 2c coupled between the power supply line Vcc and the ground voltage line GND. The p-channel enhancement type switching transistor 2a and the n-channel enhancement type switching transistor 2b are complementarily gated by the drain node D2, and the n-channel enhancement type load transistor 2c keeps the drain node D3 lower than the threshold level of the n-channel enhancement type load transistor 2c.

When the power switch turns on, the drain node D2 rises together with the power supply line Vcc, and is kept lower than the power supply line Vcc because of the load transistors 1a and 1b. The p-channel enhancement type switching transistor 2a turns on, and the p-channel enhancement type switching transistor 2a increases the voltage level at the common drain node D4 between the switching transistors 2a and 2b. The voltage level at the common drain node D4 is relayed through the inverter 3 to the inverter 4, and, accordingly, the inverter 4 lifts the voltage level of a power-on signal PON.

However, if the drain node D2 exceeds a predetermined voltage level or a threshold level given by the threshold circuit 2, the n-channel enhancement type switching transistor 2b turns on, and, accordingly, the p-channel enhancement type switching transistor 2a turns off. The n-channel enhancement type switching transistor 2b decreases the voltage level at the common drain node D4, and the voltage level at the common drain node D4 is twice inverted by the inverters 3 and 4. Therefore, the power-on signal PON is decayed to the active low voltage level. Though not shown in the drawings, the power-on signal PON is supplied to digital component circuits (not shown), and the digital component circuits become ready for operation state through an initialization thereof.

The prior art power-on detecting circuit shifts the power-on signal PON at timing determined by the component transistors 1a to 1c and 2a to 2c, and the shift timing is affectable by the threshold level and the channel resistances of the component transistors 1a to 1c and 2a to 2c. However, the threshold levels and the channel resistances are liable to fluctuate due to process parameters, and the shift timing tends to be dispersed. If the shift timing is too early to initialize the digital component circuits, the digital component circuits are liable to change the initialized status due to further development of the power voltage level Vcc. Especially, an ultra large scale semiconductor memory device is equipped with a step-down voltage generating circuit, and the step-down power voltage is distributed to the component circuits. In this instance, time delay is introduced between the power voltage level and the step-down power voltage level, and the shift timing is directly produced from the power voltage level Vcc. At the results, the ultra large scale semiconductor memory device is much liable to fail in the initialization, and, accordingly, malfunction tends to take place due to the failure in the initialization.

SUMMARY OF THE INVENTION

It is therefore an important object of the present invention to provide a power-on detecting circuit which is less affectable by fluctuation in characteristics of the circuit components.

To accomplish the object, the present invention proposes to produce a power-on signal after a step-down power voltage level reaches a first constant voltage level.

In accordance with the present invention, there is provided a power-on detecting circuit associated with a step-down voltage generating circuit operative to produce a step-down power voltage level from a power voltage level on a power supply line, the step-down power voltage level rising to a first constant voltage level, the power voltage level rising to a second constant voltage level higher than the first constant voltage level, comprising: a) a timing generating unit coupled with the power supply line, and operative to produce a timing signal when the power voltage level exceeds a predetermined voltage level; b) a monitoring unit operative to compare the step-down power voltage level with a reference voltage level produced from the power voltage level, the reference voltage level rising to the first constant voltage level earlier than the reference voltage level, the monitoring circuit producing an enable signal when the step-down power voltage level becomes equal to the reference voltage level; and c) a signal generating unit enabled with the enable signal, and producing a power-on signal in the concurrent presence of the timing signal and the enable signal.

BRIEF DESCRIPTION OF THE DRAWINGS

The features and advantages of the power-on detecting circuit according to the present invention will be more clearly understood from the following description taken in conjunction with the accompanying drawings in which.

DESCRIPTION OF THE PREFERRED EMBODIMENTS

First Embodiment

Figure 2:
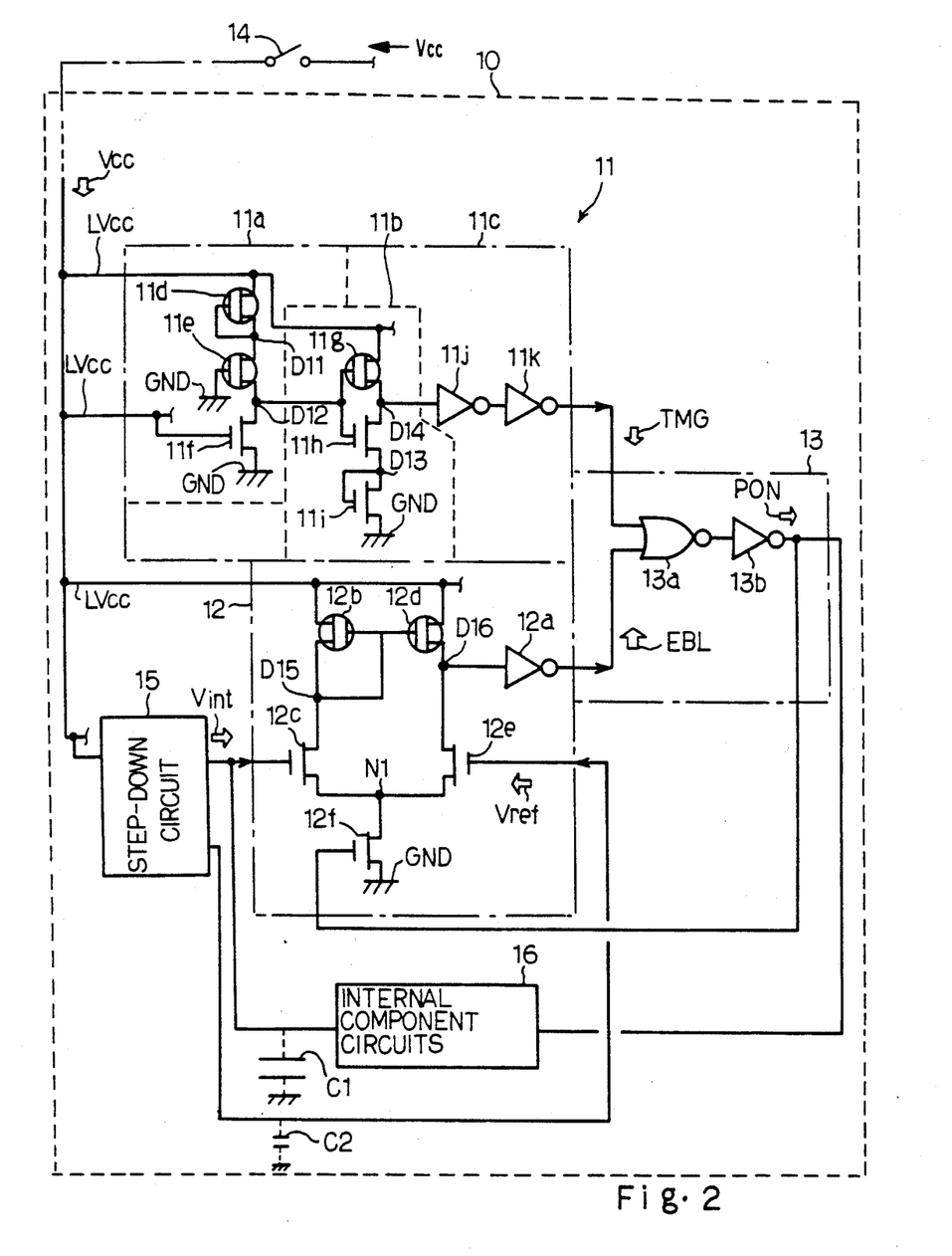
FIG. 2 is a circuit diagram showing the circuit arrangement of a power-on detecting circuit.
Figure 3:
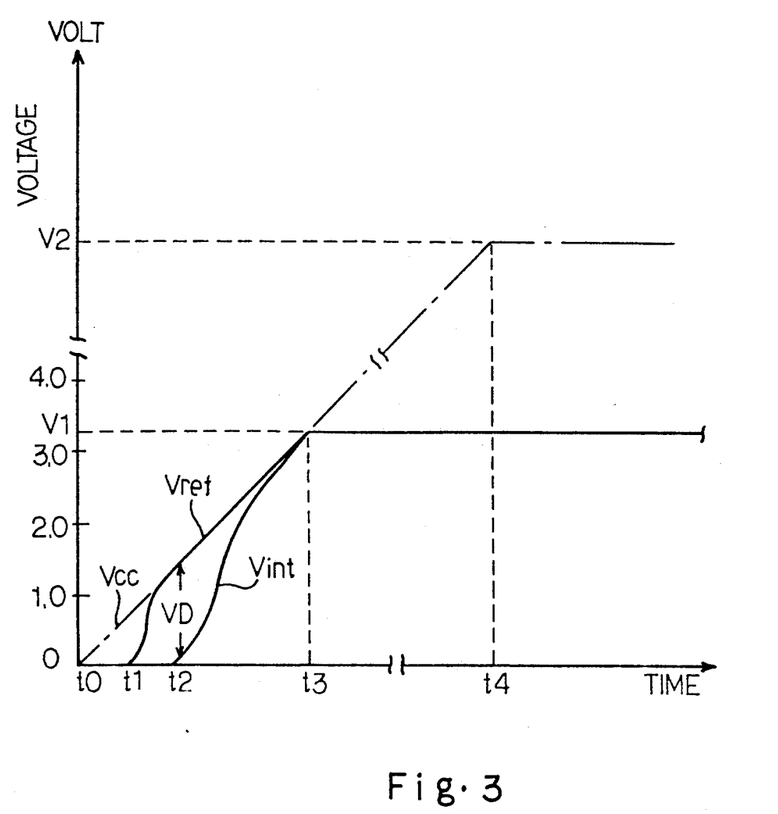
FIG. 3 is a graph showing a power voltage level, a step-down power voltage level and a reference voltage level supplied to the power-on detecting circuit shown in FIG. 2.

Referring to FIG. 2 of the drawings, a power-on detecting circuit embodying the present invention is incorporated in an ultra large scale integrated circuit fabricated on a semiconductor chip 10, and largely comprises a timing generating circuit 11, a monitoring circuit 12 and a signal generating circuit 13. A power voltage level Vcc is supplied from a power switch 14 of an electronic system outside thereof, and is supplied through a stabilizer (not shown) to a step-down voltage generating circuit 15, the timing generating circuit 11 and a monitoring circuit 12. The step-down voltage generating circuit 15 produces a step-down power voltage level Vint and a reference voltage level Vref from the power voltage level Vcc, and the step-down power voltage level Vint is distributed to internal component circuits 16. A typical example of a step-down voltage generating circuit is disclosed in U.S. Pat. No. 5,121,007, and has a reference signal generating circuit for producing a reference signal, and a voltage regulating unit for producing an internal power voltage. The voltage regulating unit is responsive to the reference signal, and for this reason, the reference signal rises faster than the internal power voltage. The internal component circuits 16 are equivalent to a large amount of capacitive load C1, however, a small amount of capacitive load C2 is merely driven by the reference voltage level Vref. For this reason, the reference voltage level Vref rises to a first constant voltage level V1 earlier than the step-down power voltage level Vint as shown in FIG. 3. Namely, if the power switch 14 turns on, the power voltage level Vcc- starts on rising toward a second constant voltage level V2 at time t0. The small amount of capacitive load C2 retards the reference voltage level Vref, and, accordingly, the reference voltage level Vref starts on rising at time t1. However, the large amount of capacitive load C1 introduces long time delay, and the step-down power voltage level Vint starts on rising toward the first constant power voltage level V1 at time t2. The amount of time delay between times t0 and t1 and the amount of time delay between times t1 and t2 are regulable with the capacitive loads C1 and C2. Both of the step-down power voltage level Vint and the reference voltage level Vref reach the first constant voltage level V1 at time t3, and the power voltage level Vcc reaches the second constant voltage level at time t4. In this instance, the first constant voltage level is adjusted to about 3.3 volts.

Turning back to FIG. 1 of the drawings, the timing generating circuit 11 comprises a voltage divider 11a, a threshold circuit 11b and a driver circuit 11c. The voltage divider 11a is implemented by a series combination of load transistors 11d, 11e and 11f coupled between a power supply line LVcc and a ground voltage line GND. The load transistor 11d is of the p-channel enhancement type, and the gate electrode thereof is coupled with the drain node D11 thereof. The load transistor 11e is also of the p-channel enhancement type, and the gate electrode thereof is coupled with the ground voltage line GND. However, the load transistor 11f is of the n-channel enhancement type, and the gate electrode thereof is coupled with the power supply line LVcc. The voltage divider 11a is operative to divide the power voltage level Vcc, and an auxiliary step-down voltage level takes place at the common drain node D12 between the load transistors 11e and 11f.

The threshold circuit 11b is implemented by a series combination of a p-channel enhancement type switching transistor 11g, an n-channel enhancement type switching transistor 11h and an n-channel enhancement type load transistor 11i coupled between the power supply line LVcc and the ground voltage line GND. The p-channel enhancement type switching transistor 11g and the n-channel enhancement type switching transistor 11h are complementarily gated by the common drain node D12, and the n-channel enhancement type load transistor 11i keeps the drain node D13 lower than the threshold level of the n-channel enhancement type load transistor 11i with respect to the ground voltage level. The threshold circuit 11b thus arranged monitors the voltage level at the common drain node D12, and decays the voltage level at the common drain node D14 between the switching transistors 11g and 11h when the common drain node D12 reaches a predetermined voltage level. In this instance, the predetermined voltage level is regulated to about 2.0 volts.

The driver circuit 11c is implemented by a series combination of inverters 11j and 11k, and a timing signal TMG of active low voltage level is produced at the output node of the inverter 11k.

The monitoring circuit 12 is implemented by a differential amplifier circuit accompanied with an inverter 12a, and comprises a series combination of a p-channel enhancement type load transistor 12b and an n-channel enhancement type driving transistor 12c coupled between the power supply line LVcc and a common node N1, a series combination of a p-channel enhancement type load transistor 12d and an n-channel enhancement type driving transistor 12e also coupled between the power supply line LVcc and the common node N1, and an n-channel enhancement type activation transistor 12f coupled between the common node N1 and the ground voltage line GND. The two p-channel enhancement type load transistors 12b and 12d are coupled in current mirror fashion, and, accordingly, the gate electrodes thereof are coupled with a drain node D15 of the p-channel enhancement type load transistor 12b. The step-down power voltage level Vint and the reference voltage level Vref are respectively supplied to the gate electrodes of the n-channel enhancement type driving transistors 12c and 12e, and the n-channel enhancement type activation transistor 12f is gated with a power-on signal PON supplied from the signal generating circuit 13. The drain node D16 of the p-channel enhancement type load transistor 12d is coupled with the input node of the inverter 12a, and an enable signal EBL is produced at the output node of the inverter 12a. The monitoring circuit 12 thus arranged monitors the step-down power voltage level Vint to see if or not the step-down power voltage level Vint reaches the first constant voltage level V1, and the enable signal EBL is produced upon reaching the first constant voltage level V1.

Since the time delay between the step-down power voltage level Vint and the reference voltage level Vref produces voltage difference VD, and the voltage difference VD is decreased toward time t3. The voltage difference VD is applied between the gate electrodes of the n-channel enhancement type driving transistors 12c and 12e, and the channel conductance of the driving transistor 12e is initially larger than that of the driving transistor 12c. However, the channel conductance of the driving transistor 12c becomes closer to the channel conductance of the driving transistor 12e with time, and the voltage level at the drain node D16 is gradually lifted. When the step-down power voltage level Vint catches up the reference voltage level Vref, both of the step-down power voltage level Vint and the reference voltage level Vref reach the first constant voltage level V1, and the voltage level at the drain node D16 exceeds the threshold level of the inverter 12a. Then, the inverter 12a shifts the enable signal EBL to the active low voltage level, and the enable signal EBL is supplied to the signal generating circuit 13.

The signal generating circuit 13 comprises a NOR gate 13a and an inverter 13b, and the NOR gate 13a is enabled with the enable signal EBL of the active low voltage level. When the NOR gate 13a is enabled, the NOR gate 13a becomes responsive to the timing signal of the low voltage level, and the NOR gate 13a shifts the voltage level at the output node thereof to the high voltage level. The high voltage level is supplied from the NOR gate 13a to the inverter 13b, and the inverter 13b shifts the power-on signal PON to the active low voltage level. The power-on signal PON is supplied to the n-channel enhancement type activation transistor 12f, and the n-channel enhancement type activation transistor 12f turns off so as to terminates the monitoring operation. As a result, no current is consumed by the monitoring circuit 12, and the power consumption is improved. However, the timing generating circuit 11 is continued to remain active, and the power-on detecting circuit according to the present invention can cope with unintentional service interruption. The power-on signal PON is further supplied to the internal component circuits 16, and the internal component circuits 16 are initialized to become ready for operation.

Figure 4:
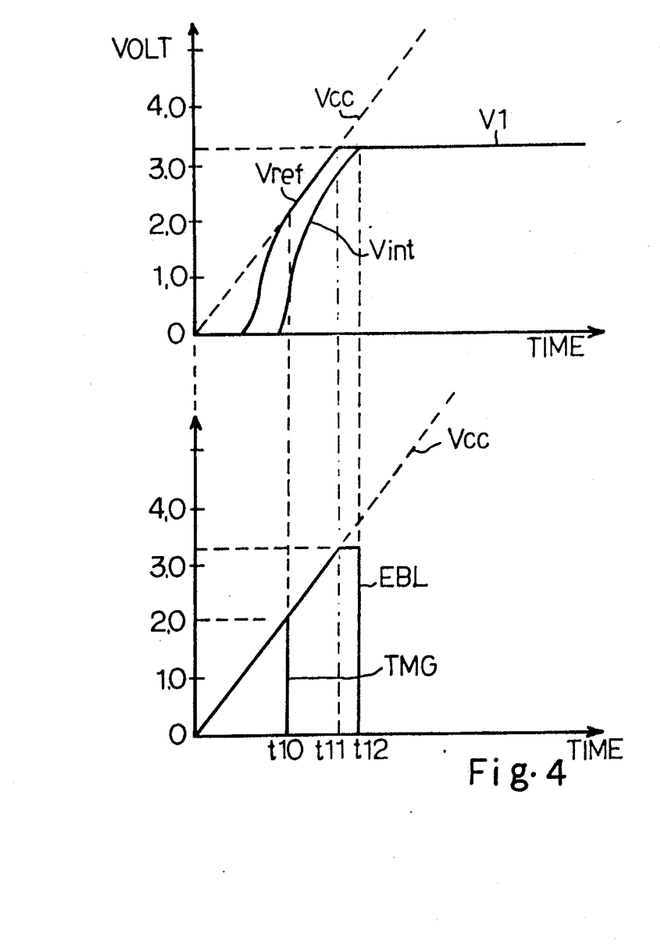
FIG. 4 is a graph showing circuit behavior of the power-on detecting circuit when the power voltage level rapidly rises.

Description is hereinbelow made on allover circuit behavior of the power-on detecting circuit according to the present invention with reference to FIGS. 4 and 5. FIG. 4 shows the step-down power voltage level Vint and the reference voltage level Vref, and the power voltage level Vcc is assumed to rapidly rise. The power voltage level Vcc exceeds the predetermined voltage level of 2.0 volts at time t10, and the driving circuit 11c concurrently shifts the timing signal TMG to the active low level. If the power-on signal PON is shifted to the active low voltage level at time t10, the internal component circuits 16 would be incompletely initialized, because the step-down power voltage level Vint merely reaches about 0.5 volt. However, the enable signal EBL remains in the inactive high voltage range, and the signal generating circuit 13 has not been enabled yet. For this reason, the power-on signal PON remains in the inactive high voltage range. The step-down power voltage level Vint becomes equal to the reference voltage level Vref at time t12 after the reference voltage level Vref reaches the first constant voltage level V1 at time t11. Then, the enable signal EBL is shifted to the active low voltage level, and the signal generating circuit 13 shifts the power-on signal PON to the active low voltage level in the concurrent presence of the enable signal EBL and the timing signal TMG. Thus, the internal component circuits 16 are initialized after the step-down power voltage level Vint reaches the first constant voltage level V1 in case of rapid rise of the power voltage level Vcc.

Figure 5:
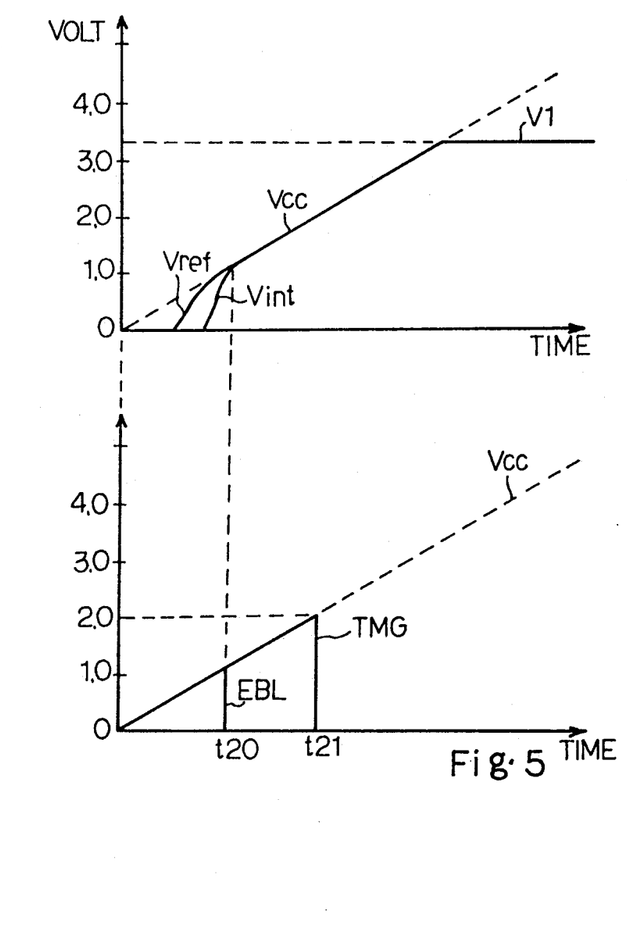
FIG. 5 is a graph showing circuit behavior of the power-on detecting circuit when the power voltage level slowly rises.

If, on the other hand, the power voltage level Vcc is slowly increased as shown in FIG. 5, the step-down power voltage level Vint becomes equal to the reference voltage level Vref at time t20 before reaching the first constant voltage level V1, and the monitoring circuit 12 shifts the enable signal EBL to the active low voltage level. However, the power voltage level Vcc has not reached the predetermined voltage level of 2.0 volts yet, and the power-on signal PON remains in the inactive high voltage range. If the internal component circuits 16 are initialized at time t20, the initialization is carried out with the step-down power voltage level Vint of about 1.0 volt, and the internal component circuits 16 would be incompletely initialized. However, the initialization is postponed to time t21. Namely, if the power voltage level exceeds the predetermined voltage level at time t21, the driving circuit 11c shifts the timing signal TMG to the active low voltage level. Since the signal generating circuit 13 has been already enabled, the power-on signal PON is shifted to the active low voltage level, and the internal component circuits 16 are initialized. Thus, the internal component circuits 16 are initialized after reaching the predetermined voltage level, and malfunction hardly takes place.

Since the differential amplifier circuit and, accordingly, the monitoring circuit 12 is less affectable with fluctuation of process parameters, and the power-on signal PON is shifted to the active low voltage level after the step-down power voltage level Vint is sufficiently increased. This results in a perfect initialization of the internal component circuits 16.

Second Embodiment

Figure 6:
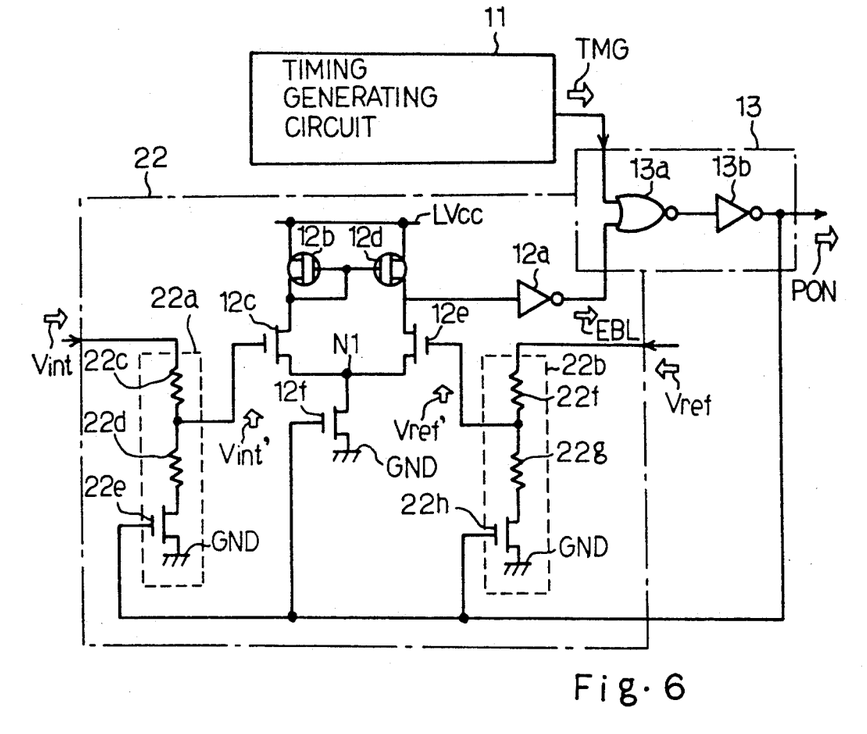
FIG. 6 is a circuit diagram showing the circuit arrangement of a monitoring circuit incorporated in another power-on detecting circuit according to the present invention.

Turning to FIG. 6 of the drawings, another power-on detecting circuit embodying the present invention largely comprises a timing generating circuit 11, a monitoring circuit 22 and a signal generating circuit 13. Since the timing generating circuit 11 and the signal generating circuit 13 are similar in circuit arrangement to those of the first embodiment, no further description is incorporated hereinbelow.

The monitoring circuit 22 contains two voltage dividers 22a and 22b, and the step-down power voltage level Vint and the reference voltage level Vref are firstly supplied to the voltage dividers 22a and 22b, respectively. The voltage dividers 22a and 22b produce respective step-down voltage levels Vint' and Vref', and are supplied to the differential amplifier circuit. However, the differential amplifier circuit and the inverter are similar in circuit arrangement to those of the first embodiment, and circuit components are labeled with the same references designating the corresponding circuit components.

The voltage divider 22a is implemented by a series combination of resisters 22c and 22d and an n-channel enhancement type switching transistor 22e coupled between the source of the step-down power voltage level Vint and the ground voltage line GND, and the voltage divider 22b is also implemented by a series combination of resisters 22f and 22g and an n-channel enhancement type switching transistor 22h coupled between the source of the reference voltage level Vref and the ground voltage line GND. The n-channel enhancement type switching transistors 22e and 22h are controlled with the power-on signal PON, and cut off the current paths after the initialization.

Since the differential amplifier circuit is supplied with the step-down voltage levels Vint' and Vref', the maximum channel conductances of the n-channel enhancement type driving transistors 12c and 12e are smaller than those of the first embodiment, and the enable signal EBL swings the voltage level thereof within a relatively narrow range.

Figure 7:
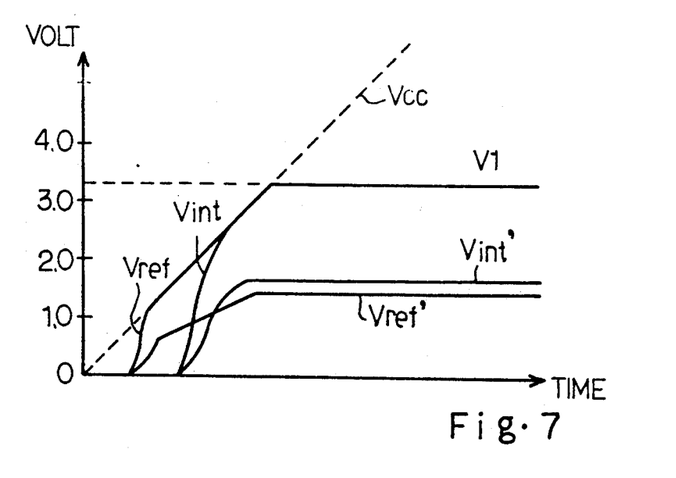
FIG. 7 is a graph showing a power voltage level, a step-down power voltage level and a reference voltage level supplied to the power-on detecting circuit shown in FIG. 6.

The resisters 22c, 22d, 22f and 22g are liable to fluctuate the resistances due to the process parameters. If the step-down voltage level Vref' is higher than the step-down voltage level Vint', the step-down voltage level Vint' never becomes equal to the step-down voltage level Vref', and the inverter 12a never shifts the enable signal EBL to the active low voltage level. In order to avoid such undesirable situation, the resistances of the resisters 22c, 22d, 22f and 22g are determined in such a manner that the step-down voltage level Vint' is saturated at a constant voltage level equal to or higher than that of the step-down voltage level Vref' as shown in FIG. 7. For this reason, it is recommendable to cause the step-down voltage level Vint' to be saturated at a higher level than the step-down voltage level Vref' even if undesirable fluctuation takes place.

The circuit behavior or the power-on detecting circuit implementing the second embodiment is analogous to that of the first embodiment, and no further description is incorporated hereinbelow for avoiding repetition.

As will be appreciated from the foregoing description, the signal generating circuit 13 is enabled with the enable signal EBL from the monitoring circuit less affectable with fluctuation of process parameters, and the power-on signal PON is decayed to the active low voltage level after the step-down power voltage level Vint is sufficiently developed. This results in perfect initialization of the internal component circuits.

Although particular embodiments of the present invention have been shown and described, it will be obvious to those skilled in the art that various changes and modifications may be made without departing from the spirit and scope of the present invention. For example, the power-on detecting circuit according to the present invention is available for any electric circuit with dual power supply system, and is not limited to a semiconductor integrated circuit.

What is claimed is:

1. A power-on detecting circuit operative to produce a power-on signal and associated with a step-down voltage generating circuit operative to produce a step-down power voltage level from a power voltage level on a power supply line, said step-down power voltage level rising to a first constant voltage level, said power voltage level rising to a second constant voltage level higher than said first constant voltage level, comprising:

a) a timing generating unit coupled with said power supply line, and having a threshold of a predetermined voltage level, said timing generating unit being operative to produce a timing signal when said power voltage level exceeds said threshold;

b) a monitoring unit operative to compare said step-down power voltage level with a reference voltage level produced from said power voltage level, said reference voltage level rising to said first constant voltage level earlier than said step-down power level, said monitoring circuit producing an enable signal when said step-down power voltage level becomes equal to said reference voltage level; and c) a signal generating unit enabled with said enable signal, and producing said power-on signal while said enable signal and said timing signal or presence.

2. A power-on detecting circuit as set forth in claim 1, in which said timing generating unit comprises a-1) a voltage divider supplied with said power voltage level and producing an auxiliary step-down voltage level, a-2) a threshold circuit supplied with said power voltage level and said auxiliary step-down voltage level, and monitoring said auxiliary step-down voltage level to see whether or not said auxiliary step-down voltage level exceeds a predetermined threshold level corresponding to said predetermined voltage level, and a-3) driving circuit operative to produce said timing signal when said auxiliary step-down voltage level exceeds said predetermined threshold level.

3. A power-on detecting circuit as set forth in claim 1, in which said monitoring unit comprises b-1) a differential amplifier circuit operative to compare said step-down power voltage level with said reference voltage level to see whether or not said step-down power voltage level becomes equal to said reference voltage level, and b-2) an enable signal producing means operative to produce said enable signal when said step-down power voltage level becomes equal to said reference voltage level.

4. A power-on detecting circuit as set forth in claim 3, in which said differential amplifier circuit comprises a first series combination of a first load transistor and a first driving transistor coupled between said power supply line and a common node, a second series combination of a second load transistor and a second driving transistor coupled between said power supply line and said common node, and an activating transistor coupled between said common node and a constant voltage line and activating said first and second driving transistors in the absence of said power-on signal.

5. A power-on detecting circuit as set forth in claim 3, in which said enable signal producing means is implemented by an inverter.

6. A power-on detecting circuit as set forth in claim 1, in which said signal generating unit comprises c-1) a first logic gate enabled with said enable signal, and responsive to said timing signal, and c-2) a power-on signal generating means coupled with an output node of said first logic gate, and producing said power-on signal in the concurrent presence of said enable signal and said timing signal at input nodes of said first logic gate.

7. A power-on detecting circuit as set forth in claim 6, in which said first logic gate is implemented by a NOR gate.

8. A power-on detecting circuit as set forth in claim 1, in which said monitoring unit comprises b-1) a pair of voltage dividers operative to respectively decrease said step-down power voltage level and said reference voltage level in magnitude, b-2) a differential amplifier circuit supplied with the decreased step-down power voltage level and the decreased reference voltage level from said pair of voltage dividers, and operative to compare said decreased step-down power voltage level with said decreased reference voltage level to see whether or not said decreased step-down power voltage level becomes equal to said decreased reference voltage level, and b-3) an enable signal producing means operative to produce said enable signal when said decreased step-down power voltage level becomes equal to said decreased reference voltage level.

9. A power-on detecting circuit as set forth in claim 8, in which said differential amplifier circuit comprises a first series combination of a first load transistor and a first driving transistor coupled between said power supply line and a common node, a second series combination of a second load transistor and a second driving transistor coupled between said power supply line and said common node, and an activating transistor coupled between said common node and a constant voltage line and activating said first and second driving transistors in the absence of said power-on signal.

10. A power-on detecting circuit as set forth in claim 8, in which each of said pair of voltage dividers is implemented by a series combination of resisters and a switching transistor shifted to on-state in the absence of said power-on signal.

* * * * *